(12) United States Patent
Choi

(10) Patent No.: US 11,270,940 B2
(45) Date of Patent: Mar. 8, 2022

(54) SEMICONDUCTOR DEVICE

(71) Applicant: SK hynix Inc., Icheon-si (KR)

(72) Inventor: Young Hun Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 48 days.

(21) Appl. No.: 16/438,721

(22) Filed: Jun. 12, 2019

(65) Prior Publication Data

US 2020/0176373 A1    Jun. 4, 2020

(30) Foreign Application Priority Data

Dec. 4, 2018 (KR) .................. 10-2018-0154662

(51) Int. Cl.

| | | |
|---|---|---|
| *H01L 23/528* | (2006.01) | |
| *H01L 27/146* | (2006.01) | |
| *H01L 27/24* | (2006.01) | |
| *H01L 25/00* | (2006.01) | |
| *H01L 25/18* | (2006.01) | |

(52) U.S. Cl.
CPC .......... *H01L 23/528* (2013.01); *H01L 25/18* (2013.01); *H01L 25/50* (2013.01); *H01L 27/1469* (2013.01); *H01L 27/14603* (2013.01); *H01L 27/14634* (2013.01); *H01L 27/14636* (2013.01); *H01L 27/14645* (2013.01); *H01L 27/2463* (2013.01); *H01L 27/14612* (2013.01); *H01L 27/14621* (2013.01); *H01L 27/14627* (2013.01)

(58) Field of Classification Search
CPC ............ H01L 23/528; H01L 27/14603; H01L 27/14636; H01L 27/14634; H01L 27/1469; H01L 27/2463; H01L 25/18
See application file for complete search history.

(56) References Cited

U.S. PATENT DOCUMENTS

| | | | |
|---|---|---|---|
| 10,074,605 B2 | 9/2018 | Liaw | |
| 2004/0141077 A1* | 7/2004 | Ohkawa | ............ H01L 27/14623 348/308 |
| 2015/0261437 A1* | 9/2015 | Lee | ........................ H01L 23/528 710/5 |
| 2015/0279888 A1* | 10/2015 | Chen | ................. H01L 27/14634 257/459 |
| 2018/0005938 A1* | 1/2018 | Liaw | ................. H01L 27/10897 |
| 2018/0337121 A1 | 11/2018 | Liaw | |

FOREIGN PATENT DOCUMENTS

KR    10-2012-0012096    2/2012

* cited by examiner

*Primary Examiner* — Aaron J Gray
(74) *Attorney, Agent, or Firm* — Perkins Coie LLP

(57) ABSTRACT

A semiconductor device is disclosed. The semiconductor device includes at least one row line arranged in a first direction over a cell array region, and at least one column line arranged in a second direction intersecting the first direction over the cell array region. The row line and the column line are configured to include conductive lines located at different levels and coupled to each other through a contact in the cell array region.

14 Claims, 5 Drawing Sheets

SEMICONDUCTOR DEVICE

CROSS-REFERENCE TO RELATED APPLICATION

This patent document claims priority to and benefits of the Korean patent application number 10-2018-0154662 filed on Dec. 4, 2018, which is incorporated herein by reference in its entirety.

TECHNICAL FILED

The technology and implementations disclosed in this patent document relate to a semiconductor device including double-layer conductive lines.

BACKGROUND

Some semiconductor devices have array structures where a plurality of unit elements is arranged in rows and columns. For example, a memory device includes a cell array structure in which a plurality of memory cells is arranged in a matrix shape, and an image sensor includes a pixel array structure in which a plurality of photosensing pixels for capturing light is arranged in a matrix shape.

Such array structures include a plurality of conductive lines configured to address the memory cells in a memory or the photosensing pixels in an imaging sensor. Some of the conductive lines extend in a row direction and are selected based on row addresses. Some other conductive lines extend in a column direction and are selected based on column addresses. Therefore, the conductive lines extending in the row direction and the conductive lines extending in the column direction are arranged at different levels separated from one another by at least one insulation layer. For example, conductive lines arranged in the column direction may be formed above the conductive lines arranged in the row direction.

Some semiconductor manufacturers recently are conducting intensive research to integrate a cell array and a control circuit for controlling the cell array into a single device by forming the cell array and the circuit in two different wafers and connecting those two wafers to each other by using bonding techniques.

However, when a first wafer includes a cell array and row and column address conductive lines and a second wafer includes the control circuit, a bonding of the first wafer to the second wafer requires separate bonding regions to be formed outside the cell array in the first wafer to couple the conductive lines formed in a lower layer of the first wafer to the control circuit formed on the second wafer.

In other words, while the conductive lines located in an upper layer of the first wafer can be directly bonded to the second water, conductive lines located in the lower layer of the first wafer may need to extend to outside the cell array region to be coupled to the second wafer outside the cell array region.

Such an extension of the bonding region may lead to an increase in a chip size.

SUMMARY

This patent document provides, among others, designs of a semiconductor device that includes a bonding structure that allows to connect conductive lines of the semiconductor device to another semiconductor device without increasing the size of the semiconductor device.

Some embodiments of the disclosed technology relate to a semiconductor device having a hybrid bonding structure through which different wafers are bonded to each other.

In an embodiment of the disclosed technology, a semiconductor device may include at least one row line arranged in a first direction over the cell array region, and at least one column line arranged in a second direction intersecting the first direction over the cell array region. The at least one row line and the at least one column line may be configured to include conductive lines located at different levels separated from one another by at least one insulation layer and coupled to each other through a contact in the cell array region.

In another embodiment of the disclosed technology, a semiconductor device may include a first row line disposed in a first sub-region of a cell array region, the first row line extending in a first direction, a first column line disposed in a second sub-region of the cell array region, the first column line extending in a second direction intersecting the first direction at the same level as the first row line, a second column line disposed over the first row line in the first sub-region, the second column line extending in the second direction, and a second row line disposed over the first column line in the second sub-region, the second row line extending in the first direction at the same level as the second column line. The first row line and the second row line may be coupled to each other through a first contact.

In yet another embodiment of the disclosed technology, a semiconductor device may include a first bonding element including a cell array region, and a second bonding element including a plurality of circuits configured to generate signals needed to address the cells. In the first bonding element, the cell array region may include a plurality of cells arranged in a matrix shape, a row line coupled to the cells and extending in a first direction, and a column line coupled to the cells, and formed to extend in a second direction perpendicular to the first direction. The row line and the column line may be configured in a manner that conductive lines disposed at different levels separated from one another by at least one insulation layer are coupled to each other through a contact in the cell array region.

In yet another embodiment of the disclosed technology, a semiconductor device may include at least one row line disposed in a cell array region and arranged to traverse the cell array region in a first direction, and at least one column line disposed in the cell array region and arranged to traverse the cell array region in a second direction perpendicular to the first direction. The at least one row line and the at least one column line may be configured to include a specific structure in which conductive lines located at different levels are coupled to each other through a contact in the cell array region.

In yet another embodiment of the disclosed technology, a semiconductor device may include a first row line disposed in a first sub-region of a cell array region, and formed to extend in a first direction, a first column line disposed in a second sub-region of the cell array region, and formed to extend in a second direction perpendicular to the first direction at the same level as the first row line, a second column line disposed over the first row line in the first sub-region, and formed to extend in the second direction, and a second row line disposed over the first column line in the second sub-region, and formed to extend in the first direction. The first row line and the second row line may be coupled to each other through a first contact.

In yet another embodiment of the disclosed technology, a semiconductor device may include a first bonding element provided with a cell array region, and a second bonding element provided with a plurality of circuits configured to generate signals needed to address the cells. In the first bonding element, the cell array region may include a plurality of cells arranged in a matrix shape, a row line coupled to the cells, and formed to extend in a first direction, and a column line coupled to the cells, and formed to extend in a second direction perpendicular to the first direction. In the second bonding element, the row line and the column line may be configured in a manner that conductive lines disposed at different levels are coupled to each other through a contact in the cell array region.

In yet another embodiment of the disclosed technology, a semiconductor device includes at least one row line arranged in a first direction over a cell array region, and at least one column line arranged in a second direction intersecting the first direction over the cell array, region, wherein the at least one row line and the at least one column line are configured to include a specific structure in which one part of a certain conductive line and the other part of the certain conductive line are arranged at different heights from a bottom surface of the semiconductor device and different parts of the conductive lines located at different heights from the bottom surface of the semiconductor device are coupled to each other through a contact in the cell array region.

In yet another embodiment of the disclosed technology, a semiconductor device includes a first row line disposed in a first sub-region of a cell array region, the first row line extending in a first direction, a first column line disposed in a second sub-region of the cell array region, the first column line extending in a second direction intersecting the first direction at the same heights from a bottom surface of the semiconductor device as the first row line, a second column line disposed over the first row line in the first sub-region, the second column line extending in the second direction, and a second row line disposed over the first column line in the second sub-region, the second row line extending in the first direction.

In yet another embodiment of the disclosed technology, a semiconductor comprising a first bonding element including a cell array region, wherein the cell array region includes a plurality of cells arranged in a matrix shape, a row line coupled to the cells and extending in a first direction, and a column line coupled to the cells, and formed to extend in a second direction perpendicular to the first direction, and a second bonding element including a plurality of circuits configured to generate signals needed to address the cells, wherein the row line and the column line are configured in a manner that conductive lines disposed at different levels are coupled to each other through a contact in the cell array region, and wherein conductive lines disposed at different levels are arranged at different heights from a bottom surface of the semiconductor device.

It is to be understood that both the foregoing general description and the following detailed description of the present disclosure are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
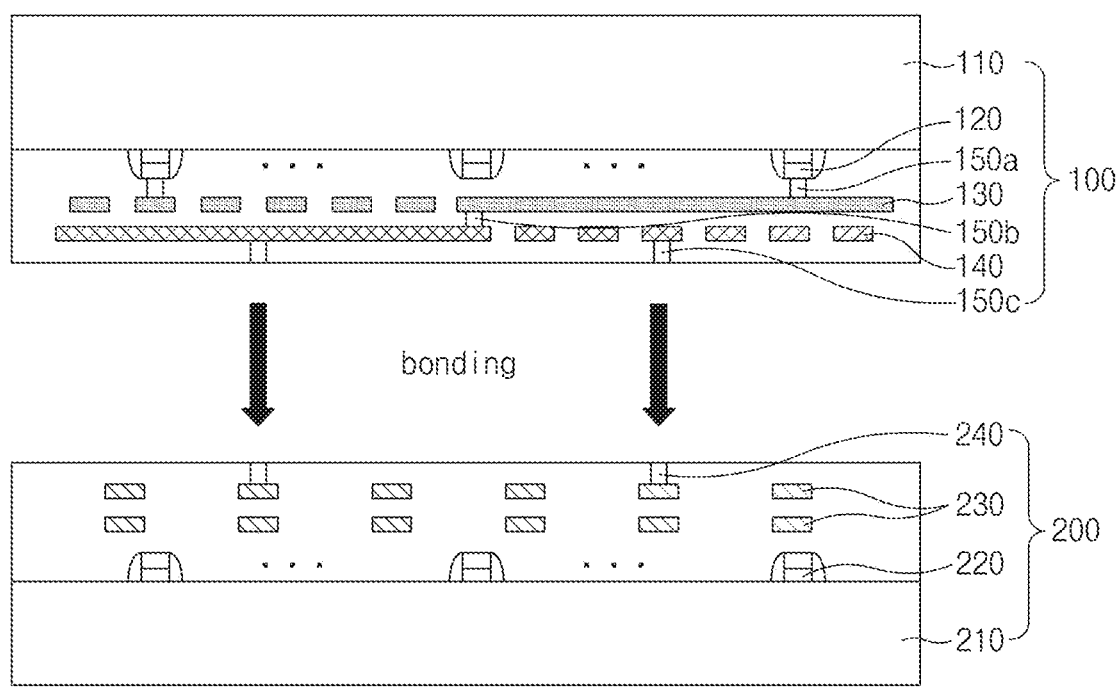
FIG. 1 is a cross-sectional view illustrating an example of a plurality of conductive lines for use in a semiconductor device based on an embodiment of the disclosed technology.
Figure 2:
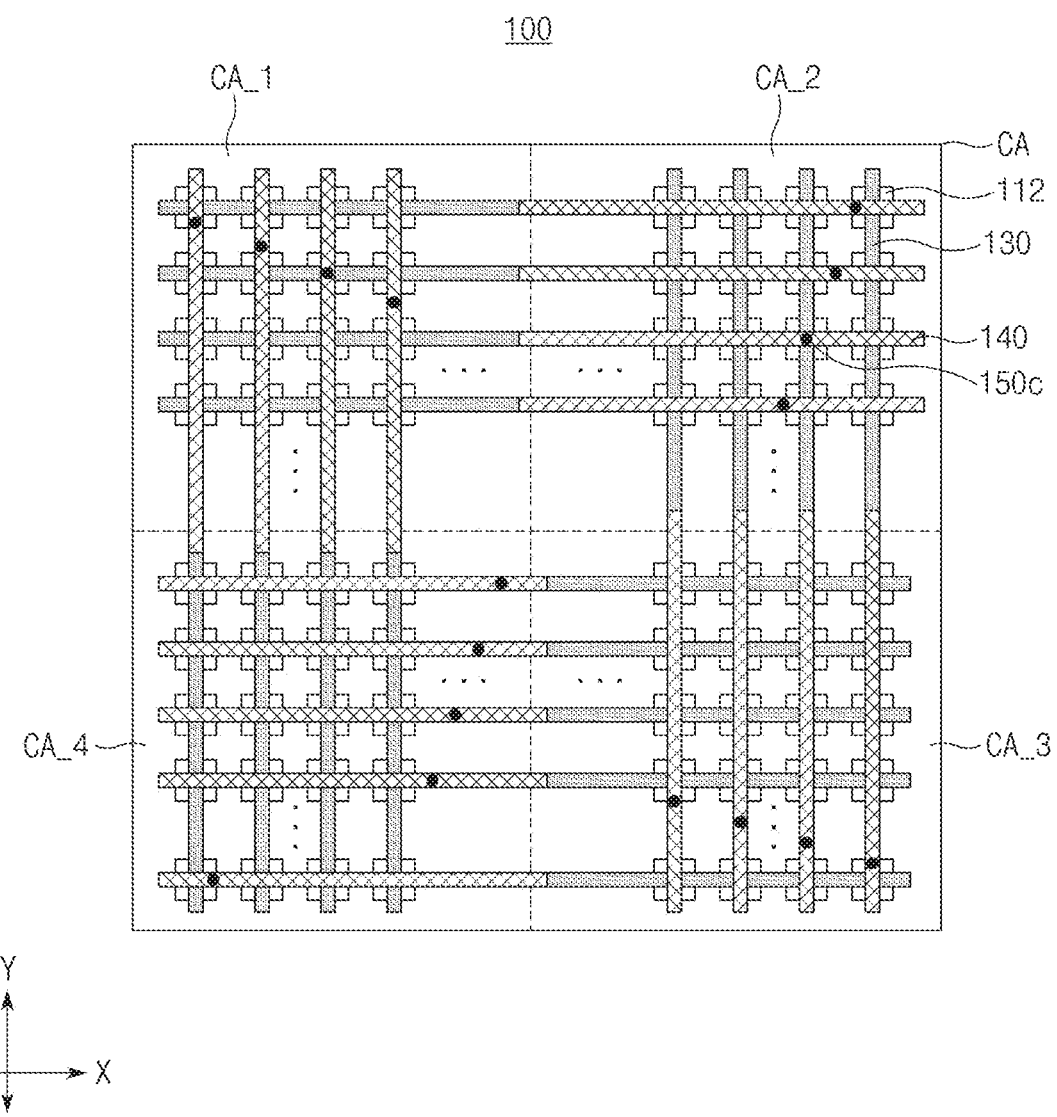
FIG. 2 is a schematic diagram illustrating an example of a first bonding element shown in FIG. 1 based on an embodiment of the disclosed technology.

FIG. 1 is a cross-sectional view illustrating a plurality of conductive lines for use in a semiconductor de vice based on an embodiment of the disclosed technology. FIG. 2 is a schematic diagram illustrating a first bonding element 100 shown in FIG. 1.

Referring to FIGS. 1 and 2, the semiconductor device may include a first bonding element 100 and a second bonding element 200. For example, a bottom surface of the first bonding element 100 may be directly bonded to a top surface of the second bonding element 200, resulting in formation of the semiconductor device.

The first bonding element 100 may include a cell array region CA in which unit cell elements may be arranged in a matrix shape. Here, examples of the unit cell elements can include memory cells for storing data or imaging pixels for capturing light to perform image sensing. For example, provided the semiconductor device is a memory device, the cell array region CA may include a memory cell array in which the memory cells a arranged in rows and columns (e.g., matrix shape). In case the semiconductor device is an image sensor, the cell array region CA may include a cell array in which the imaging pixels such as a photoelectric conversion element are arranged in a matrix shape.

As discussed above, the semiconductor device may include an array of the memory cells or an array of the imaging pixels. In the following description, memory cells and imaging pixels are referred to as "cell" 112 for convenience only.

The cell array region CA may include one or more selection elements 120 that operate in response to a selection signal (e.g., an address signal) received from the second bonding element 200. Each of the selection elements 120 may include a switching element (e.g., a transistor) formed over a semiconductor substrate 110.

The cell array region CA may include conductive lines 130 and 140 configured to address the cells 112. For example, the conductive lines 130 and 140 may include conductive lines that carry selection signals received from the second bonding element 200 to the selection element 120 of each cell 112, and other conductive lines that carry signals (e.g., data stored in memory cells or image signals captured by imaging pixels) from each cell 112 to the second bonding element 200.

The conductive lines 130 and 140 may be arranged in rows and columns in the cell array region CA, resulting in formation of a double-layer structure in the cell array region CA. In other words, the conductive lines extending in the row direction and the conductive lines extending in the column direction are arranged at different levels. For example, the conductive lines 130 may be formed in a lower layer, and the other conductive lines 140 may be formed over the conductive lines 130 in a manner that the conductive lines 140 may be arranged perpendicular to the conductive lines 130.

Specifically, each of first transmission (Tx) lines, which is arranged to traverse the entire cell array region CA in an X-axis direction so as to transmit selection signals or data (or image signals), and each of second transmission (Tx) lines, which is arranged to traverse the entire cell array region CA in a Y-axis direction so as to transmit a selection signal or data (or image signals), may not be formed as a single conductive line. In other word, each of the first and second transmission lines includes conductive lines 130 and 140 located at different levels and coupled to each other through a contact 150b. In this case, each of the first and second transmission (Tx) lines may functionally operate as a single line. For example, the first and second transmission (Tx) lines may be row lines and column lines or vice versa, respectively.

For example, the cell array region CA may include four sub-regions CA_1, CA_2, CA_3, and CA_4. In the sub-regions contiguous to each other in the X-axis direction or the Y-axis direction, conductive lines extending in the same direction may be formed at different levels. A detailed structure of the conductive lines 130 and 140 will hereinafter be described with reference to the attached drawings.

The conductive lines 130 may be coupled to the selection elements 120 through one or more contacts 150a. The conductive lines 130 and 140 that belong to the same row lines or the same column lines in the contiguous sub-regions may be coupled to each other through a contact 150b. The contact 150b may be located at a boundary region between two adjacent sub-regions. The conductive lines 140 may be coupled to the second bonding element 200 through one or more bonding contacts 150c. In this way, the conductive lines 130 may be coupled to the second bonding element 200.

The second bonding element 200 may include a plurality of circuits to control operations of the cells 112 formed in the first bonding element 100. For example, the second bonding element 200 may be electrically coupled to the conductive lines 140 of the first bonding elements 100. The second bonding element 200 may include a circuit that generates a selection signal to address the cells 112 and outputs the generated selection signal to the conductive lines 140. The second bonding element 200 may also include another circuit that stores data in the cells 112 selected by the selection signal or processes data (cell data or image signals) received from the cells 112 selected by the selection signal.

The second bonding element 200 may include a semiconductor substrate 210, a plurality of logic elements 220 formed over the semiconductor substrate 210, a plurality of conductive lines 230 configured to transmit signals associated with the logic elements 220 and a power-supply signal, and a plurality of bonding contacts 240 electrically coupled to the conductive lines 140 of the first bonding elements 100.

Figure 3:
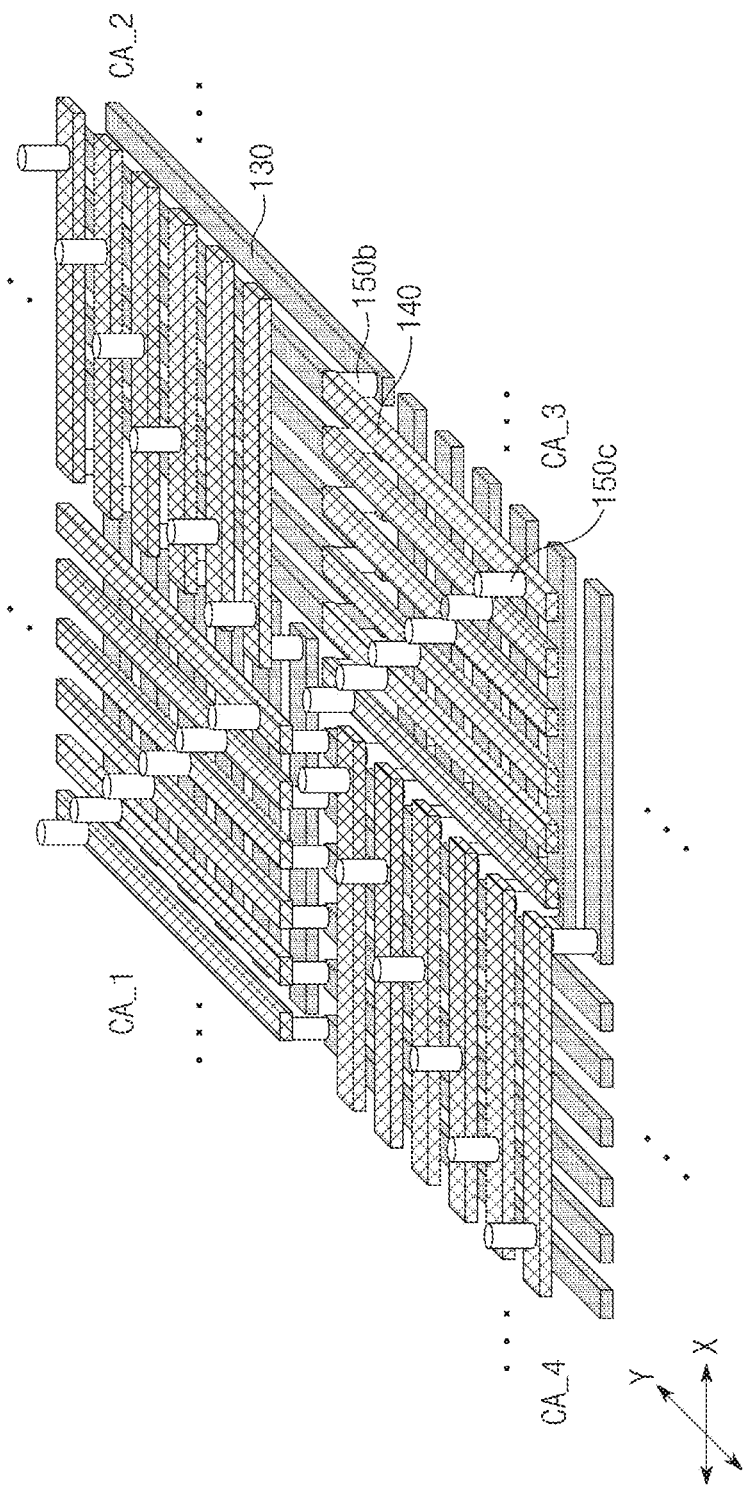
FIG. 3 is a schematic diagram illustrating an example of a plurality of conductive lines shown in FIG. 2 based on an embodiment of the disclosed technology.

FIG. 3 is a schematic diagram illustrating the conductive lines shown in FIG. 2 based on an embodiment of the disclosed technology.

Referring to FIG. 3, the cell array region CA in the first bonding element 100 may be divided into four sub-regions CA_1 CA_2, CA_3, and CA_4. In some implementations, the four sub-regions CA_1, CA_2, CA_3, and CA_4 may be substantially identical in size to one another.

In each of the sub-regions CA_1, CA_3, and CA_4, the conductive lines 130 and 140 may be formed in a double-layer structure while simultaneously being arranged to cross each other. For example, a stepped transmission line may extend over two adjacent sub-regions such that a lower part (e.g., conductive line 130) of the stepped transmission line is formed over one of the two adjacent sub-regions and a higher part (e.g., conductive line 140) of the stepped transmission line is formed over the other of the two adjacent sub-regions. The lower part and the higher part of the transmission line are coupled to each other through a contact 150b. In an implementation illustrated in FIG. 3 two stepped transmission lines extend in an X-axis direction over two adjacent sub-regions, respectively, and two stepped transmission lines extend in a Y-axis direction over two adjacent sub-regions, respectively. For example, four stepped transmission lines may be arranged in the following way: (1) a first stepped transmission line extends from the sub-region CA_1 to the sub-regions CA_2 in the X-axis direction; (2) a second stepped transmission line extends from the sub-region CA_2 to the sub-regions CA_3 in the Y-axis direction; (3) a third stepped transmission line extends from the sub-region CA_3 to the sub-regions CA_4 in the X-axis direction; (4) a fourth transmission conductive line extends from the sub-region CA_4 to the sub-regions CA_1 in the Y-axis direction.

For example, in the sub-region CA_1, the conductive lines 130 (e.g., lower part of a first stepped transmission line) may be formed to extend in the X-axis direction, and the conductive lines 140 (e.g., higher part of the fourth stepped transmission line) formed over the conductive lines 130 may be formed to extend in the Y-axis direction.

In the sub-region CA_2 adjacent to the sub-region CA_1 in the X-axis direction, the conductive lines 130 (e.g., lower part of the second stepped transmission line) may be formed to extend in the Y-axis direction, and the conductive lines 140 (e.g., higher part of the first stepped transmission line) formed over the conductive lines 130 may extend in the X-axis direction.

In the sub-region CA_4 adjacent to the sub-region CA_1 in the Y-axis direction, the conductive lines 130 (e.g., lower part of the fourth stepped transmission line) may be formed to extend in the Y-axis direction, and the conductive lines 140 (e.g., higher part of the third stepped transmission line) formed over the conductive lines 130 may extend in the X-axis direction.

In the sub-region CA_3, which is adjacent to the sub-region CA_2 in the Y-axis direction and is adjacent to the sub-region CA_4 in the X-axis direction, the conductive lines 130 (e.g., lower part of the third stepped transmission line) may extend in the X-axis direction, and the conductive lines 140 (e.g., higher part of the second stepped transmission line) formed over the conductive lines 130 may extend in the Y-axis direction.

In the sub-regions adjacent to each other in the X-axis direction or in the Y-axis direction, each conductive line 130 and each conductive line 140 that are located at different levels separated from one another by at least one insulation layer while simultaneously extending in the same direction may be coupled to each other through the contacts 150b.

For example, in the sub-region CA_1, the conductive lines 130 corresponding to the lower layers may extend in the X-axis direction. In the sub-region CA_2 contiguous to the sub-region CA_1 in the X-axis direction, the conductive lines 140 corresponding to the upper layers may extend in the X-axis direction. The conductive lines 130 of the sub-region CA_1 and the conductive lines 140 of the sub-region CA_2 may be coupled to each other through the contacts 150b. In the sub-region CA_4, the conductive lines 140 corresponding to the upper layer may extend in the X-axis direction. In the sub-region CA_3 contiguous to the sub-region CA_4 in the X-axis direction, the conductive lines 130 corresponding to the lower layers may extend in the X-axis direction. The conductive lines 140 of the sub-region CA_4 and the conductive lines 130 of the sub-region CA_3 may be coupled to each other through one or more contacts 150b.

Therefore, the conductive lines 130 of the sub-region CA_1, the conductive lines 140 of the sub-region CA_1, the conductive lines 140 of the sub-region CA_4, and the conductive lines 130 of the sub-region CA_3, which are coupled to one another through the contacts 150b, may be row lines that are arranged over the cell array region CA in the X-axis direction.

Likewise, in the sub-region CA_1, the conductive lines 140 corresponding to the upper layers may be formed to extend in the Y-axis direction. In the sub-region CA_4 adjacent to the sub-region CA_1 in the Y-axis direction, the conductive lines 130 corresponding to the lower layers may be formed to extend in the Y-axis direction. The conductive lines 130 of the sub-region CA_4 and the conductive lines 140 of the sub-region CA_1 may be coupled to each other through one or more contacts 150b. In the sub-region CA_2, the conductive lines 130 corresponding to the lower layers may be formed to extend in the Y-axis direction. In the sub-region CA_3 contiguous to the sub-region CA_2 in the Y-axis direction, the conductive lines 140 corresponding to the upper layers may extend in the Y-axis direction. The conductive lines 130 of the sub-region CA_2 and the conductive lines 140 of the sub-region CA_3 may be coupled to each other through one or more contacts 150b.

Therefore, the conductive lines 140 of the sub-region CA_1, the conductive lines 130 of the sub-region CA_4, the conductive lines 130 of the sub-region CA_2, and the conductive lines 140 of the sub-region CA_3, which are coupled to one another through the contacts 150b, may be column lines that are arranged over the cell array region CA in the Y-axis direction.

In the sub-regions CA_1, C_2, CA_3, and CA_4, the conductive lines 140 may be coupled to the second bonding element 200 via the bonding contacts 150c.

In some embodiment of the disclosed technology, the row lines arranged to traverse the cell array region CA in the X-axis direction and the column lines arranged to traverse the cell array region CA in the Y-axis direction include the conductive lines 130 and the conductive lines 140 different in level from the conductive lines 130 so that all of the row and column lines can include column lines 140.

When the first bonding element 100 is bonded to the second bonding element 200, the conductive lines 140 of the uppermost layer may be directly coupled to the second bonding element 200 through the bonding contacts 150c formed in the cell array region CA.

However, it is difficult for the conductive lines 130 situated at the lower layers to be directly coupled to the second bonding element 200 through contacts in the cell array region CA due to the presence of other conductive lines 140 disposed over the conductive lines 130. Therefore, in order to directly couple the conductive lines 130 to the second bonding element 200, there should be a bonding region here a contact is formed to connect the conductive lines 130 to circuitry disposed outside the cell array region CA, and at least one contact for coupling the conductive lines 130 to the second bonding element 200 is formed in the bonding region. In this case, an extra space is needed in the first bonding element 100 to form the bonding region.

As described above, if both row line and column line include conductive lines 140 at the uppermost layer, all of the row lines and the column lines may be directly coupled to the second bonding element 200 through the conductive lines 140 in the cell array region CA. As a result, the first bonding element 100 may be reduced in size, such that the semiconductor device can be reduced in size.

Figure 4:
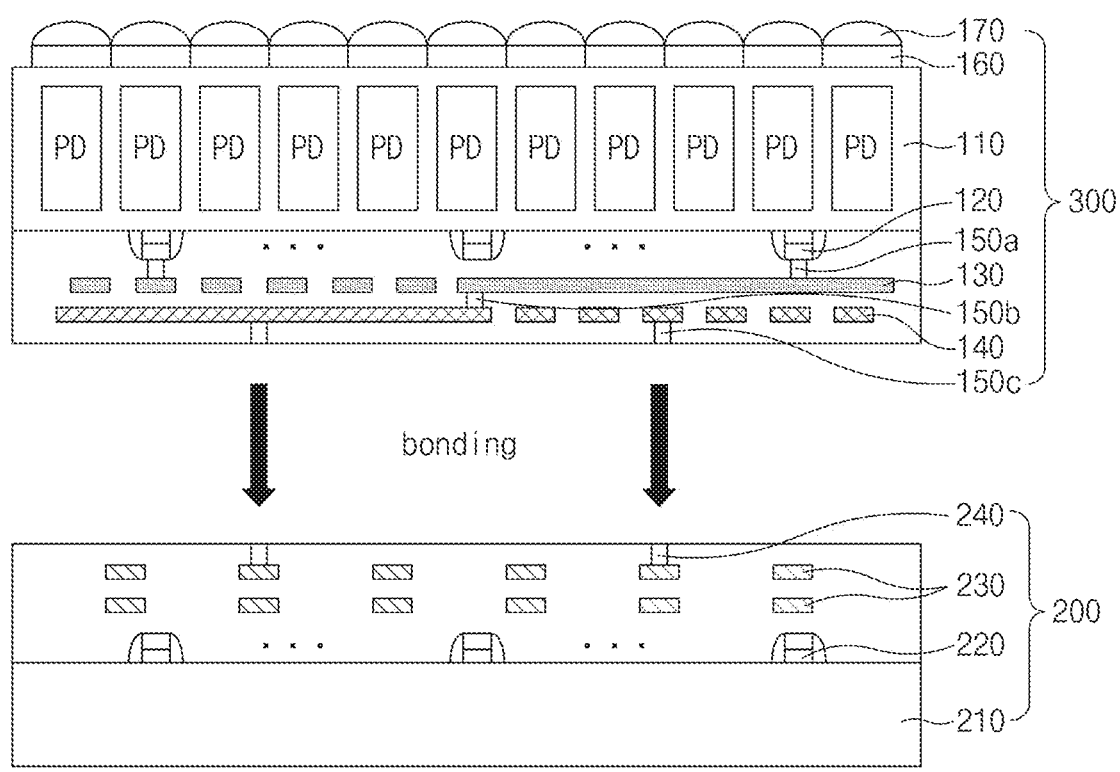
FIG. 4 is a cross-sectional view illustrating an example of the plurality of conductive lines shown in FIGS. 1 to 3 applied to an image sensor based on an embodiment of the disclosed technology.

FIG. 4 is a cross-sectional view illustrating the plurality of conductive lines shown in FIGS. 1 to 3 applied to an image sensor based on an embodiment of the disclosed technology.

Referring to FIG. 4, the first bonding element 300 may include a photoelectric conversion element (e.g., a photo-diode PD) formed in the semiconductor substrate 110, a color filter array 160 formed over a first surface of the semiconductor substrate 110, a microlens array 170 formed over the color filter array 160, and conductive lines 130 and 140 formed over a second surface of the semiconductor substrate 110.

Figure 5:
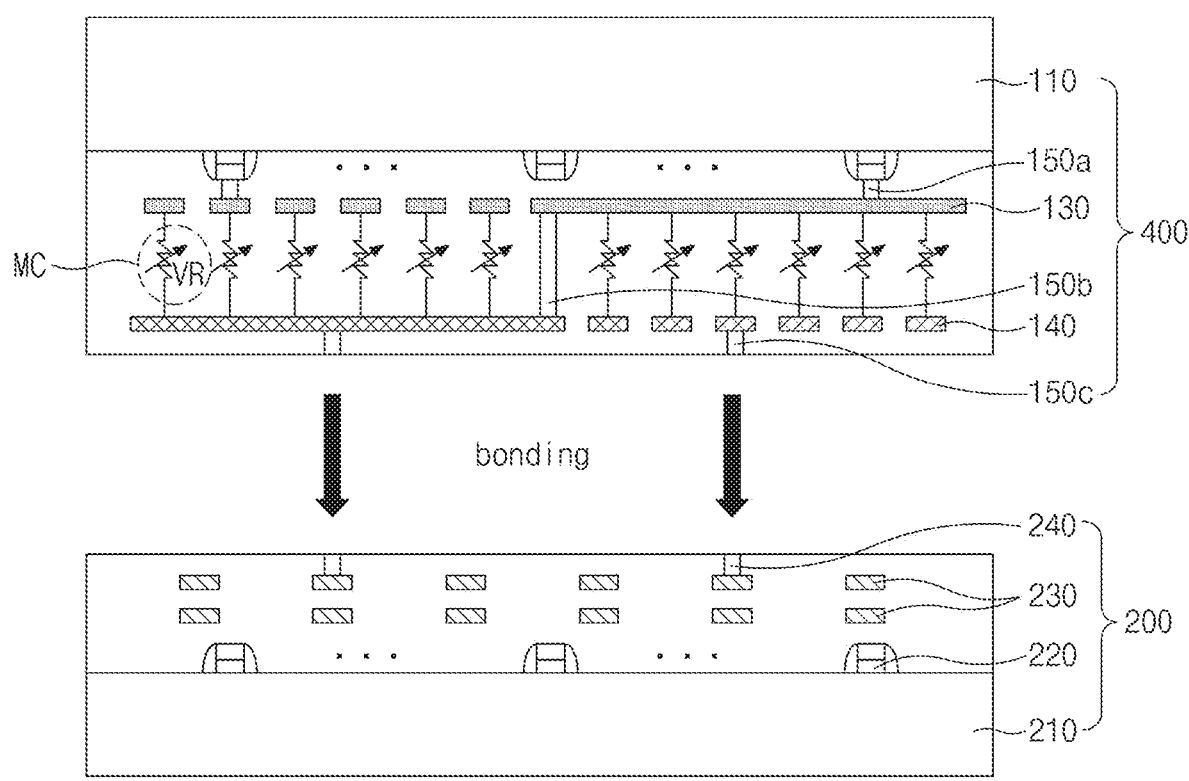
FIG. 5 is a cross-sectional view illustrating an example of the plurality of conductive lines shown in FIGS. 1 to 3 applied to a memory device based on an embodiment of the disclosed technology.

FIG. 5 is a cross-sectional view illustrating the plurality of conductive lines shown in FIGS. 1 to 3 applied to a memory device based on an embodiment of the disclosed technology.

Referring to FIG. 5, the first bonding element 400 may include a plurality of memory, cells (MC) to store data therein.

For example, each of the memory cells (MC) may include a variable resistor VR coupled to the conductive lines 130 and 140 at a cross point where the conductive lines 130 and 140 are arranged to cross each other.

In this case, transmission (Tx) lines that include conductive lines 130 and 140 extending in the X-axis direction, and other transmission (Tx) lines that include conductive lines 130 and 140 extending in the Y-axis direction may be respectively used as row lines and column lines to address the memory cells (MC).

As is apparent from the above description, the semiconductor device implemented based on some embodiments of the disclosed technology may reduce the size thereof by forming conductive lines using a hybrid bonding structure that allows a functionally identical conductive line to be formed at different levels so that a part of the functionally identical conductive line extending at a higher height can be connected to a different wafer via contacts without increasing the size of the semiconductor device.

Only a few implementations and examples are described for the disclosed technology. Other implementations, enhancements and variations can be made based on what is described and illustrated in this patent document

What is claimed is:

1. A semiconductor device comprising:
 a first sub-region including a first plurality of cells arranged in a first two dimensional matrix;
 a second sub-region adjacent to the first sub-region in a first direction and including a second plurality of cells arranged in a second two dimensional matrix, wherein each cell of the first and second plurality of cells includes one or more circuit components coupled to form a circuit;
 a plurality of first conductive row lines arranged at a first level in the first sub-region, each first conductive row line of the plurality of first conductive row lines extending in the first direction to completely traverse the first sub region;
 a plurality of first conductive column lines arranged at a second level different from the first level in the first sub-region and electrically isolated from the plurality of first conductive row lines, each first conductive column line of the plurality of first conductive column lines extending in a second direction intersecting the first direction to traverse each of the plurality of first conductive row lines;

a plurality of second conductive column lines arranged at the first level in the second sub-region, each second conductive column line of the plurality of second conductive column lines extending in the second direction to completely traverse the second sub region; and a plurality of second conductive row lines arranged at the second level in the second sub-region and electrically isolated from the plurality of second conductive column lines, each second conductive row line of the plurality of second conductive row lines extending in the first direction to traverse each of the plurality of second conductive column lines;

wherein the first conductive row lines and the second conductive row lines are coupled to each other through first contacts, the plurality of first conductive row lines are separated from the plurality of second conductive column lines in the first direction and the plurality of first conductive column lines are separated from the plurality of second conductive row lines in the first direction.

2. The semiconductor device according to claim 1, further comprising:
first bonding contacts disposed over the first conductive column lines in the first sub-region; and
second bonding contacts disposed over the second conductive row lines in the second sub-region.

3. The semiconductor device according to claim 1, wherein the first plurality of cells and the second plurality of cells are structured either as memory cells for storing data or as photosensing pixels for detecting incident light to capture images.

4. The semiconductor device according to claim 1, wherein the first contacts are located at a boundary region between the first sub-region and the second sub-region.

5. The semiconductor device according to claim 1, further comprising:
a third sub-region adjacent to the second sub-region in the second direction and including cells arranged in a matrix;
a fourth sub-region adjacent to the first sub-region in the second direction and including cells arranged in a matrix;
a plurality of third row lines arranged at the first level in the third sub-region line and extending in the first direction to traverse the third sub-region;
a plurality of third column lines arranged at the second level in the third sub-region and extending in the second direction to cross the third row lines;
a plurality of fourth column lines arranged at the first level in the fourth sub-region and extending in the second direction to traverse the fourth sub-region; and
a plurality of fourth row lines arranged at the second level in the fourth sub-region and extending in the first direction to cross the fourth column lines
wherein:
the third row lines and the fourth row lines are coupled to each other through second contacts;
the second column lines and the third column lines are coupled to each other through third contacts; and
the first column lines and the fourth column lines are coupled to each other through fourth contacts.

6. The semiconductor device according to claim 5, further comprising:

third bonding contacts disposed over the third column lines in the third sub-region; and
fourth bonding contacts disposed over the fourth row lines in the fourth sub-region.

7. The semiconductor device according to claim 4, wherein the first row lines are overlapped with the second row lines at a boundary region between adjacent sub-regions.

8. The semiconductor device according to claim 5, wherein the second contacts are located at a boundary region between the third sub-region and the fourth sub-region,
the third contacts are located at a boundary region between the second sub-region and the third sub-region, and
the fourth contacts are located at a boundary region between the first sub-region and the fourth sub-region.

9. A semiconductor device comprising:
a first bonding element including a cell array region, wherein the cell array region includes:
a first sub-region including a first plurality of cells arranged in a first two dimensional matrix;
a second sub-region adjacent to the first sub-region in a first direction and including a second plurality of cells arranged in a second two dimensional matrix, wherein each cell of the first and second plurality of cells includes one or more circuit components coupled to form a circuit;
a plurality of first conductive row lines arranged at a first level in the first sub-region, each first conductive row line of the plurality of first conductive row lines extending in the first direction to completely traverse the first sub-region;
a plurality of first conductive column lines arranged at a second level different from the first level in the first sub-region and electrically isolated from the plurality of first conductive row lines, each first conductive column line of the plurality of first conductive column lines extending in a second direction intersecting the first direction to traverse each of the plurality of first conductive row lines;
a plurality of second conductive column fines arranged at the first level in the second sub-region, each second conductive column line of the plurality of second conductive column fines extending in the second direction to completely traverse-the second sub-region; and
a plurality of second row lines arranged at the second level in the second sub-region and electrically isolated from the plurality of second conductive column lines, each second conductive row line of the plurality of second conductive row lines extending in the first direction to traverse each of the plurality of first conductive column lines; and
a second bonding element including a plurality of circuits configured to generate signals needed to address the cells,
wherein the first conductive row lines and the second conductive row lines are coupled to each other through first contacts, the plurality of first conductive row lines are separated from the plurality of second conductive column lines in the first direction, the plurality of first conductive column lines are separated from the plurality of second conductive row lines in the first direction, and the first bonding element and the second bonding element are coupled to each other through first bonding contacts disposed over the first column lines in the first sub-region and second bonding contacts disposed over the second row lines in the second sub-region.

10. The semiconductor device according to claim 9 wherein:
the first contacts are disposed at a boundary region between the first sub-region and the second sub-region; and
the bonding contacts are disposed over the first column lines and the second low lines.

11. The semiconductor device according to claim 1, wherein the first plurality of cells and the second plurality of cells include memory cells for storing data or photosensing pixels for detecting incident light to capture images.

12. The semiconductor device according to claim 9, wherein the cell array region further includes:
a third sub-region adjacent to the second sub-region in the second direction and including cells arranged in a matrix;
a fourth sub-region adjacent to the first sub-region in the second direction and including cells arranged in a matrix;
a plurality of third row lines arranged at the first level in the third sub-region and extending in the first direction to traverse the third sub-region;
a plurality of third column lines arranged at the second level in the third sub-region and extending in the second direction to cross the third row lines;
a plurality of fourth column lines arranged at first level in the fourth sub-region and extending in the second direction to traverse the fourth sub-region; and
a plurality of fourth row lines arranged at the second level in the fourth sub-region and extending in the first direction to cross the fourth column lines,
wherein:
the third row lines and the fourth row lines are coupled to each other through second contacts;
the second column lines and the third column lines are coupled to each other through third contacts; and
the first column lines and the fourth column lines are coupled to each other through fourth contacts.

13. The semiconductor device according to claim 12, wherein the second contacts are located at a boundary region between the third sub-region and the fourth sub-region,
the third contacts are located at a boundary region between the second sub-region and the third sub-region, and
the fourth contacts are located at a boundary region between the first sub-region and the fourth sub-region.

14. The semiconductor device according to claim 10, wherein the first row lines are overlapped with the second row lines at a boundary region between adjacent sub-regions.

* * * * *